United States Patent [19]
Fukase

[11] Patent Number: 5,691,222
[45] Date of Patent: Nov. 25, 1997

[54] METHOD OF MANUFACTURING SEMICONDUCTOR INTEGRATED CIRCUIT DEVICE HAVING A CAPACITOR ELECTRODE

[75] Inventor: Tadashi Fukase, Tokyo, Japan

[73] Assignee: NEC Corporation, Tokyo, Japan

[21] Appl. No.: 745,849

[22] Filed: Nov. 12, 1996

[30] Foreign Application Priority Data

Nov. 10, 1996 [JP] Japan .................................. 8-292363

[51] Int. Cl.⁶ .................................. H01L 21/8242
[52] U.S. Cl. .................. 437/52; 437/60; 437/919; 437/225
[58] Field of Search .................. 437/47, 52, 60, 437/919, 225

[56] References Cited

U.S. PATENT DOCUMENTS 5,418,180  5/1995  Brown ........................ 437/52
5,443,993  8/1995  Park et al. ................. 437/52
5,478,769  12/1995  Lim ............................. 437/52

*Primary Examiner*—Jey Tsai

[57] ABSTRACT

A method of manufacturing a semiconductor integrated circuit device which stores information by storing charges in a capacitor portion formed on a semiconductor substrate is provided. This method includes the steps of depositing a conductive film for forming a lower electrode of storage node capacitor portion on an insulating interlayer film formed with a contact hole for forming a contact that connects the capacitor portion with the substrate, depositing a cap oxide film on the conductive film and planarizing the cap oxide film, applying a resist on the planarized cap oxide film to a uniform thickness and forming a pattern mask of the storage node capacitor portion from the resist, etching the cap oxide film and the conductive film by using the pattern mask as a mask, and forming a lower electrode of the storage node capacitor portion by removing the cap oxide film.

7 Claims, 7 Drawing Sheets

PERIPHERAL CIRCUIT PORTION   MEMORY CELL PORTION

PERIPHERAL CIRCUIT PORTION    MEMORY CELL PORTION

PEPIPHERAL CIRCUIT PORTION   MEMORY CELL PORTION

PERIPHERAL CIRCUIT PORTION    MEMORY CELL PORTION

PERIPHERAL CIRCUIT PORTION | MEMORY CELL PORTION

METHOD OF MANUFACTURING SEMICONDUCTOR INTEGRATED CIRCUIT DEVICE HAVING A CAPACITOR ELECTRODE

BACKGROUND OF THE INVENTION

1. Field of the Invention

The present invention relates to a method of manufacturing a semiconductor integrated circuit device and, more particularly, to a method of forming a storage node capacitor portion of a memory element, e.g., a DRAM, having a capacitor portion that accumulates charges.

2. Description of the Prior Art

Currently, in the field of highly micropatterned and integrated semiconductor devices, one having a minimum design size smaller than 0.25 µm has been manufactured. To form such a small pattern, a lithography technique employing short-wave light, e.g., KrF excimer laser light, is employed.

A 256-Mb DRAM manufactured with such a formation technique has a cell structure in which a storage node capacitor portion is formed above the bit lines in order to obtain a large storage capacitance with a limited area.

FIGS. 1A to 1C are schematic sectional views for explaining a method of forming the storage node portion of a DRAM in which the storage node capacitor portion is formed above the bit lines.

As shown in FIG. 1A, an element isolation oxide film 2, word lines 5, a bit contact 6, bit lines 7, and the like are formed on a substrate 1, and an insulating interlayer film 8 is formed of an oxide film (BPSG film) doped with boron and phosphorus, or the like. Thereafter, contact holes for forming storage node contacts 9 reaching an impurity diffusion layer 4 are formed in the insulating interlayer film 8. Subsequently, polysilicon 10 for forming a lower electrode of the storage node capacitor portion is deposited. Furthermore, a photoresist 12 is applied on the polysilicon 10 in accordance with spin coating or the like.

Subsequently, as shown in FIG. 1B, the photoresist 12 is patterned with KrF excimer laser light or the like, thereby forming a pattern mask 12-1 for an upper electrode of the storage node capacitor portion.

Using this pattern mask 12-1 as a mask, the polysilicon 10 is etched to form a lower electrode 10-1 of the storage node capacitor portion (FIG. 1C).

The conventional method of manufacturing the semiconductor integrated circuit described above has drawbacks as follows.

After polysilicon forming the storage node capacitor portion is deposited, a moderate step exists between the memory cell portion and the peripheral circuit portion due to the difference in wiring (interconnect) density between the word lines and bit lines.

When performing pattern formation of the storage node capacitor portion, a difference occurs in resist film thickness between the central portion and end portion of the memory cell due to this step.

Short-wave light, e.g., KrF excimer laser light, is very sensitive to the resist film thickness, and causes variations in size of the storage node capacitor pattern between the central portion and end portion of the memory cell.

Variations in size of the storage node capacitor portion pose a serious problem in a small memory element, e.g., a 256 Mb DRAM. This is because when the storage node capacitor portion becomes large, dielectic breakdown occurs between itself and an adjacent capacitor portion; when it becomes small, the storage capacitance becomes insufficient. These variations in size of the storage node capacitor portion often cause operation errors at the end portion of the memory cell.

This problem is solved by depositing a thick insulating interlayer film 8-1 and planarizing it in accordance with, e.g., the chemomechanical polishing (CMP) method, as shown in FIGS. 2A to 2C.

When, however, the insulating interlayer film 8-1 is completely planarized, the thickness of the insulating interlayer film becomes large in the peripheral circuit portion. Then, as shown in FIG. 2C, a contact 17-1 for obtaining contact with upper layer wiring 18 becomes deep, leading to another problem.

Variations in thickness of the resist can also be eliminated by depositing thick polysilicon 10-2 and planarizing it, as may be assumed from U.S. Pat. No. 5,346,587 shown in FIGS. 3A to 3C.

When, however, the polysilicon 10-2 is planarized, the height of the storage node capacitor portion differs between the central portion and end portion of the memory cell, as shown in FIGS. 3B and 3C. In other words, the amount of stored charges differs between the central portion and end portion of the memory cell. Since the storage node capacitor portion becomes high at the end portion of the cell, the step in the upper layer wiring 18 between the memory cell portion and the peripheral circuit portion further increases in size.

SUMMARY OF THE INVENTION

The present invention has been made in order to solve the above drawbacks described above, and has as its object to provide a method of manufacturing a semiconductor integrated circuit device, which can form, in a semiconductor integrated circuit device, e.g., a DRAM, which stores information by storing charges in a capacitor portion formed on a semiconductor substrate, a storage node capacitor portion having a uniform size even at the end portion of a memory cell.

In order to achieve the above object, according to the basic aspect of the present invention, there is provided a method of manufacturing a semiconductor integrated circuit device which stores information by storing charges in a capacitor portion formed on a semiconductor substrate, comprising the steps of depositing a conductive film for forming a lower electrode of a storage node capacitor portion on an insulating interlayer film formed with a contact hole for forming a contact that connects the capacitor portion with the substrate, depositing a cap oxide film on the conductive film and planarizing the cap oxide film, applying a resist on the planarized cap oxide film to a uniform thickness and forming a pattern mask of the storage node capacitor portion from the resist, etching the cap oxide film and the conductive film by using the pattern mask as a mask, and forming a lower electrode of the storage node capacitor portion by removing the cap oxide film.

It is preferable that in the above basic aspect the conductive film be a polysilicon film and the cap oxide film be a silicon oxide film.

It is preferable that in the above basic aspect, at least an uppermost layer portion of the insulating interlayer film be formed of a non-doped silicon oxide film, the cap oxide film be formed of a silicon oxide film doped with boron and phosphorus, and after formation of the storage node capacitor portion, only the cap oxide film be selectively etched.

Furthermore, in the above basic aspect, gas-phase hydrofluoric acid is preferably used to selectively etch the cap oxide film.

According to the present invention having the above aspects, the cap oxide film is planarized, the resist is formed to have a uniform thickness, and the pattern mask of the storage node capacitor portion is formed to have a uniform thickness between the central portion and end portion of the memory cell. By using this pattern mask as a mask, the cap oxide film and the polysilicon film are etched, thereby effectively, selectively removing the cap oxide film.

Therefore, the lower electrode of the storage node capacitive portion can be formed to have a uniform size between the central portion and end portion of the memory cell, so that defects in the device conventionally occurring in the end portion of the memory cell due to the storage node capacitor portion can be eliminated.

The above and many other advantages, features and additional objects of the present invention will become manifest to those versed in the art upon making reference to the following detailed description and accompanying drawings in which preferred embodiments incorporating the principles of the present invention are shown by way of illustrative example.

DETAILED DESCRIPTION OF PREFERRED EMBODIMENTS

Figure 1A:
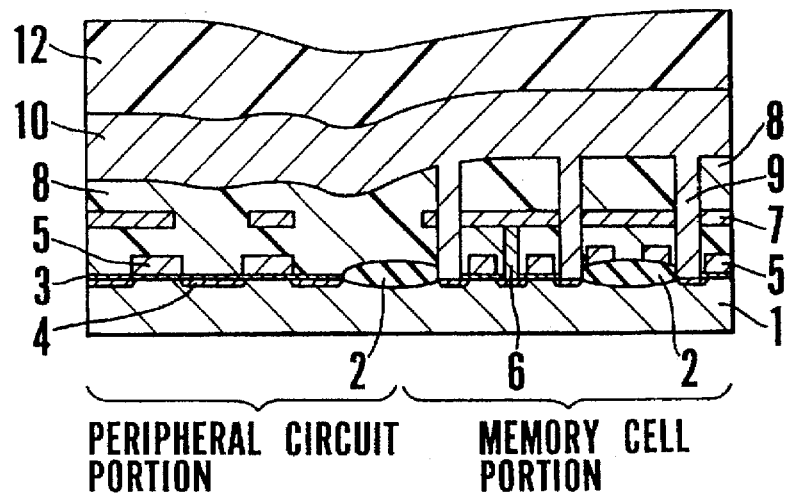
FIGS. 1A to 1C are schematic sectional views showing the first conventional method of manufacturing a semiconductor integrated circuit device in the order of its manufacturing steps.
Figure 1B:
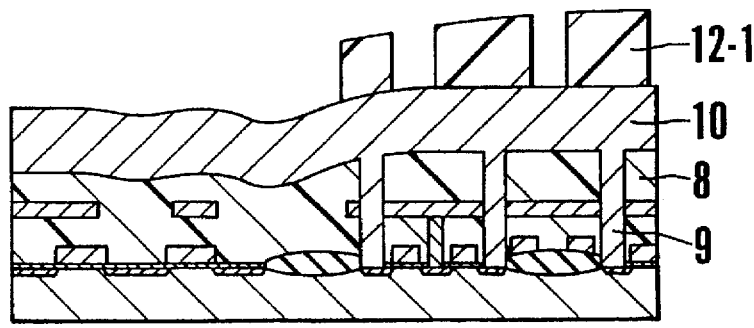
Figure 1C:
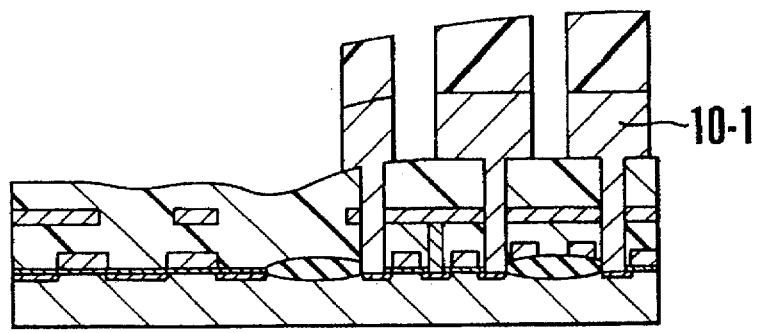
Figure 2A:
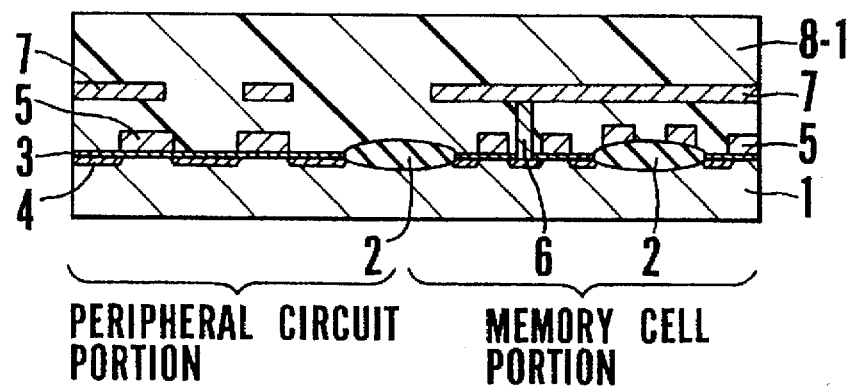
FIGS. 2A to 2C are schematic sectional views showing the second conventional method of manufacturing a semiconductor integrated circuit device in the order of its manufacturing steps.
Figure 2B:
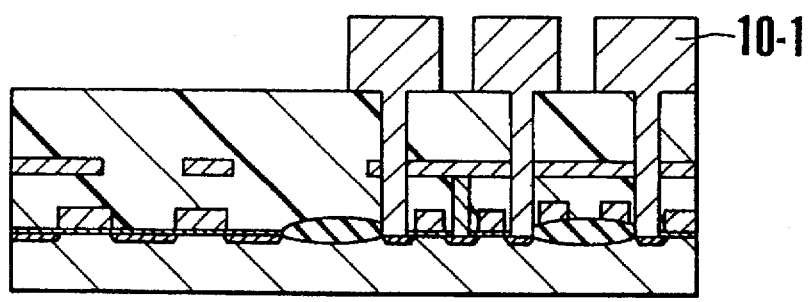
Figure 2C:
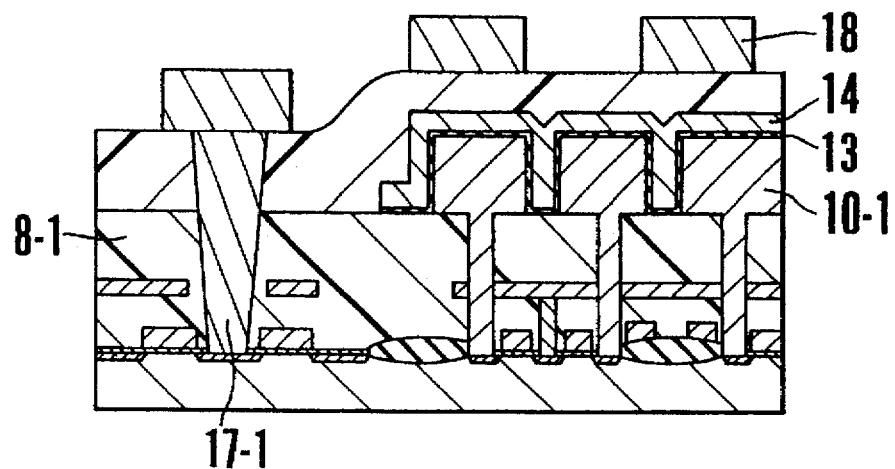
Figure 3A:
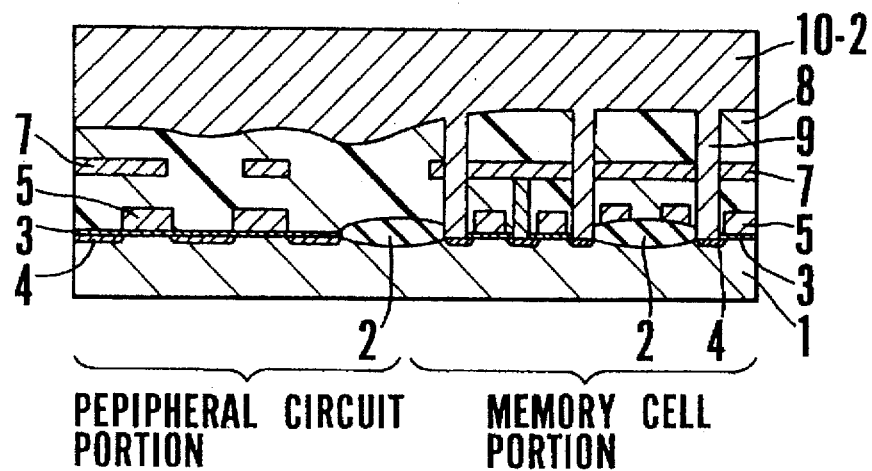
FIGS. 3A to 3C are schematic sectional views showing the third conventional method of manufacturing a semiconductor integrated circuit device in the order of its manufacturing steps.
Figure 3B:
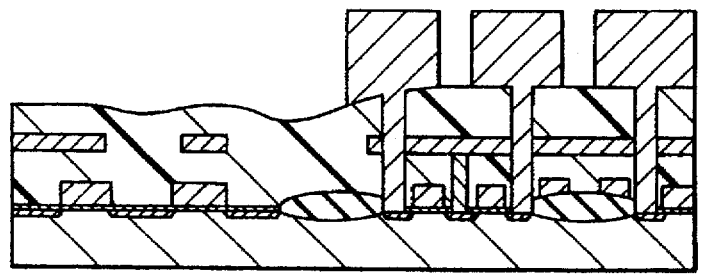
Figure 3C:
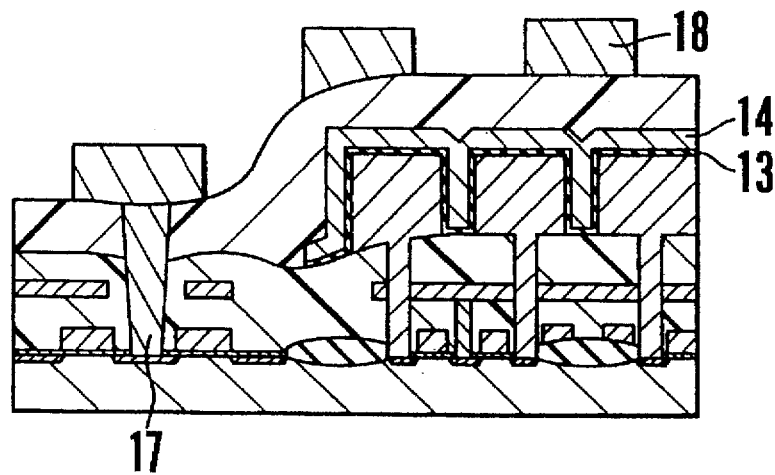

Several preferred embodiments of the present invention will be described with reference to the accompanying drawings.

A method of manufacturing a semiconductor integrated circuit device according to the first embodiment of the present invention will be described with reference to FIGS. 4A to 4E.

FIGS. 4A to 4E are schematic sectional views showing a method of manufacturing a semiconductor integrated circuit device in the order of its manufacturing steps in order to describe the first embodiment of the present invention.

Referring to FIGS. 4A to 4E, reference numeral 1 denotes a substrate; 2, an element isolation oxide film; 3, a gate oxide film; 4, an impurity diffusion layer; 5, word lines; 6, a bit contact; 7, bit lines; and 8, an insulating interlayer film, e.g., a BPSG film.

Figure 4A:
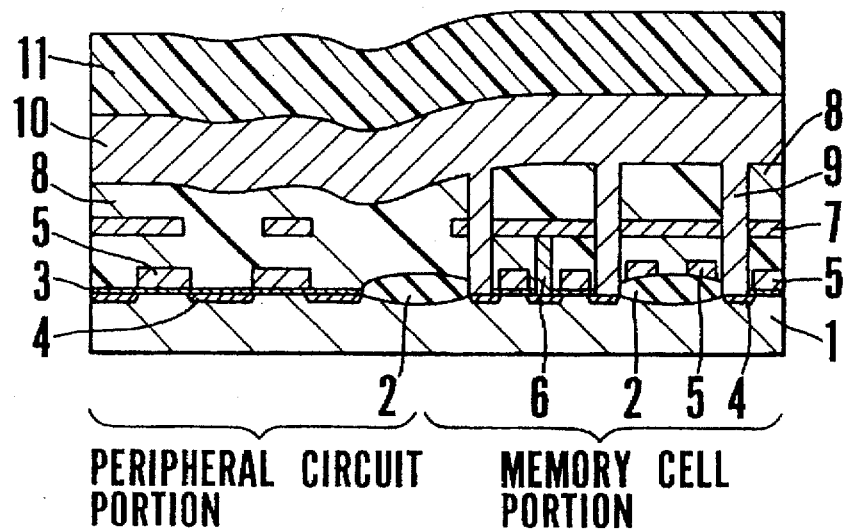
FIGS. 4A to 4E are schematic sectional views showing a method of manufacturing a semiconductor integrated circuit device according to the first embodiment of the present invention in the order of its manufacturing steps.

First, contact holes for forming storage node contacts 9 which reach the impurity diffusion layer 4 are formed in the insulating interlayer film 8, as shown in FIG. 4A.

Subsequently, polysilicon 10 for forming a lower electrode of the storage node capacitor portion is deposited on the insulating interlayer film 8. The thickness of the polysilicon 10 is determined by a necessary stored charge amount, which is about 6,000 Å to 10,000 Å in a 256-Mb DRAM. A cap oxide film 11 is deposited on the polysilicon 10 to a thickness of about 2,000 Å to 6,000 Å.

At this stage, a moderate step of about 1,000 Å to 2,000 Å exists between the memory cell portion and the peripheral circuit portion due to the difference in density of the word lines 5 and bit lines 7.

Figure 4B:
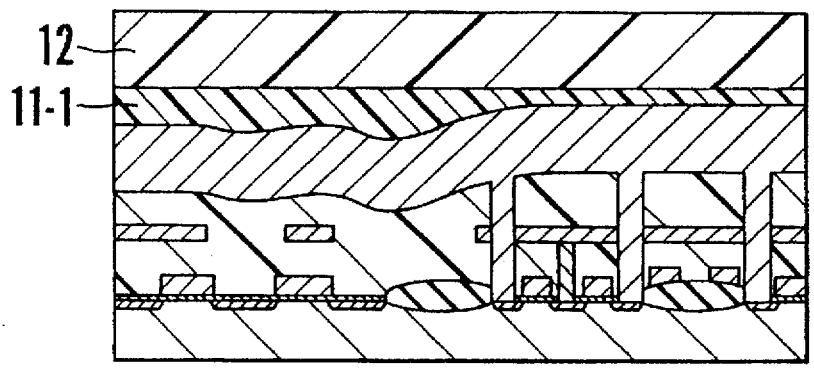

Next, the cap oxide film 11 is planarized in accordance with, e.g., CMP, to form a flat cap oxide film 11-1, as shown in FIG. 4B. Thus, the surface of the wafer is planarized, so that a photoresist 12 can be applied on the cap oxide film 11-1 with a uniform thickness.

Figure 4C:
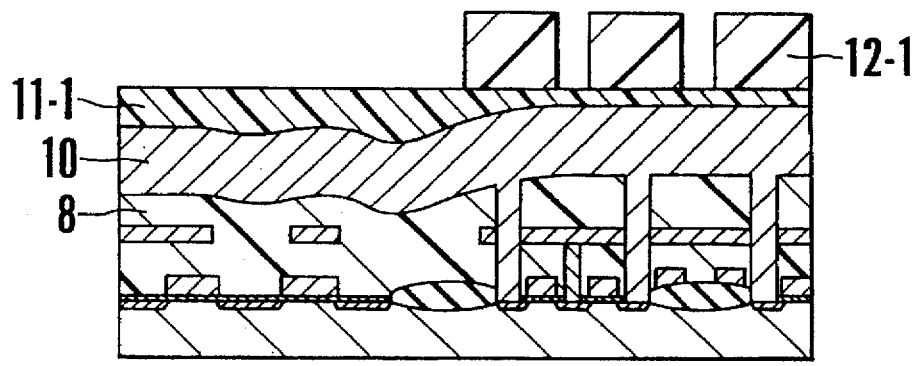

As shown in FIG. 4C, the photoresist 12 is patterned with, e.g., KrF excimer layer light, to form a pattern mask 12-1 for an upper electrode of the storage node capacitor portion. Since the thickness of the resist 12 is uniform between the central portion and end portion of the memory cell, the pattern mask 12-1 having a uniform size can be formed.

Figure 4D:
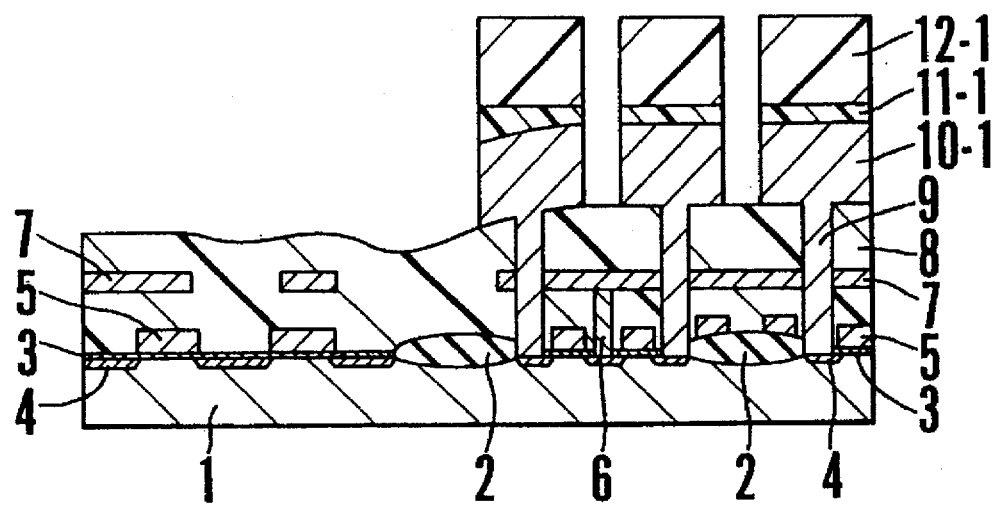

Furthermore, as shown in FIG. 4D, using the pattern mask 12-1 for the upper electrode of the storage node capacitor portion as a mask, the cap oxide film 11-1 and the polysilicon 10 are sequentially etched.

Thereafter, the resist 12-1 is peeled, and the cap oxide film 11-1 is etched with hydrofluoric acid or the like, to form a lower electrode 10-1 of the storege node capacitor portion.

Figure 4E:
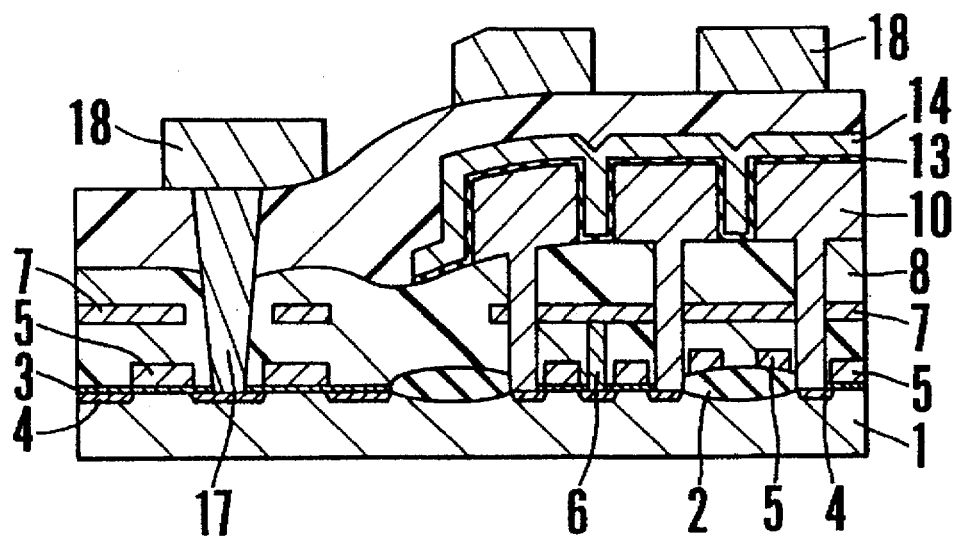

A storage node capacitor film 13, an upper electrode 14 of the storage node capacitor portion, a contact 17, and an upper layer wiring 18 are formed by using a known method (FIG. 4E).

The second embodiment of the present invention will be described with reference to FIGS. 5A to 5E.

FIGS. 5A to 5E are schematic sectional views showing a method of manufacturing a semiconductor integrated circuit device in the order of its manufacturing steps in order to describe the second embodiment of the present invention.

The characteristic feature of this second embodiment resides in that the portion above an insulating interlayer film 8 is formed of a non-doped silicon oxide film 15 and that a cap oxide film 16 is formed of a BPSG film.

The second embodiment is identical with the first embodiment in the formation of an element isolation oxide film 2, word lines 5, bit lines 7, a bit contact 6, and the like on a substrate 1 and until the formation of the insulating interlayer film 8 with a BPSG film or the like.

Figure 5A:
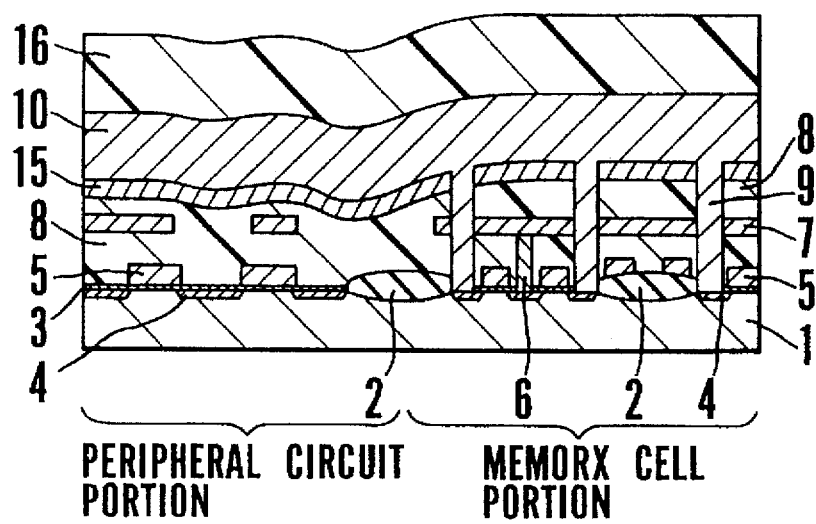
FIGS. 5A to 5E are schematic sectional views showing a method of manufacturing a semiconductor integrated circuit device according to the second embodiment of the present invention in the order of its manufacturing steps.

After a BPSG film forming the insulating interlayer film 8 is deposited on the substrate 1, as shown in FIG. 5A, the non-doped silicon oxide film 15 is further deposited on the insulating interlayer film 8 to a thickness of 500 Å to 2,000 Å.

Contact holes for forming storage node contacts 9 which reach the diffusion layer are formed in the silicon oxide film 15 and the insulating interlayer film 8, and polysilicon 10 for forming a lower electrode of the storage node capacitor portion is deposited.

Subsequently, the cap oxide film 16 is deposited on the polysilicon 10. The cap oxide film 16 is a BPSG film.

Figure 5B:
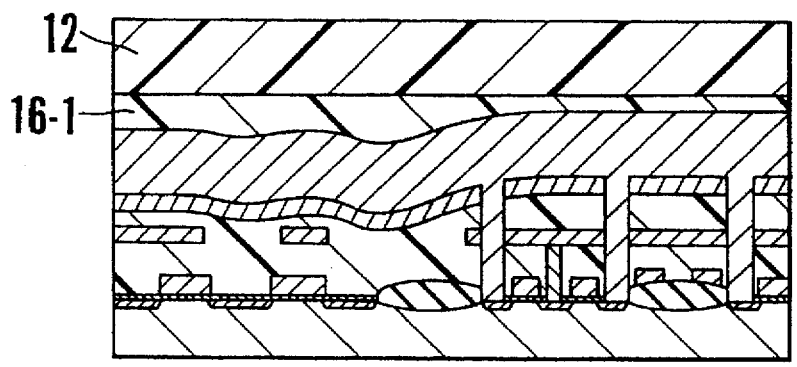

Thereafter, the cap oxide film 16 is planarized, and a photoresist 12 is applied on the cap oxide film 16 uniformly (FIG. 5B).

Figure 5C:
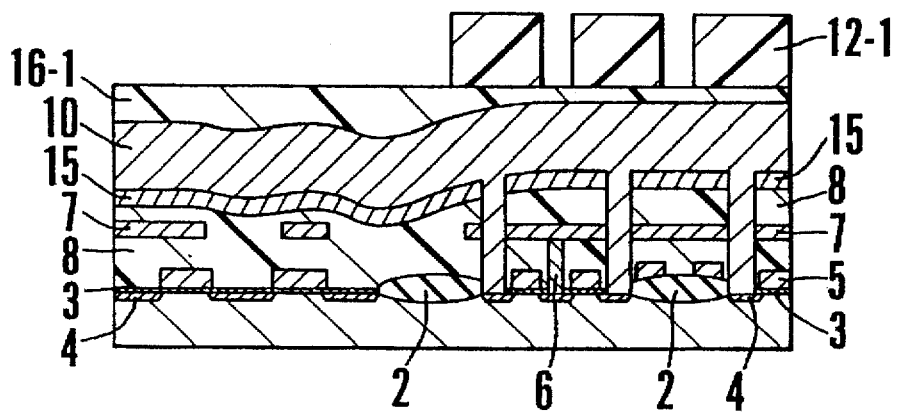

Subsequently, as shown in FIG. 5C, the resist 12 is patterned with, e.g., KrF excimer laser light, to form a pattern mask 12-1 for an upper electrode of the storage node capacitor portion. Since the resist 12 is applied to have a uniform thickness, the pattern mask 12-1 can be formed to have the same size between the central portion and end portion of the memory cell.

Figure 5D:
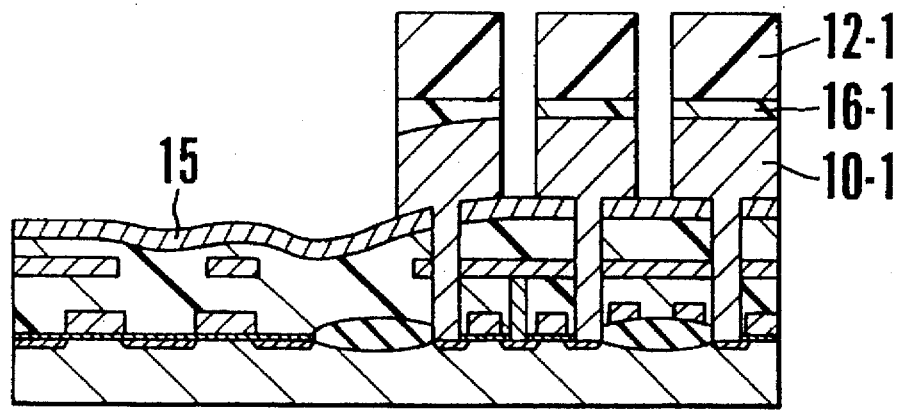

Using this pattern mask 12-1 as a mask, the cap oxide film 16 and the polysilicon 10 are sequentially etched (FIG. 5D).

The pattern mask 12-1 for the upper electrode of the storage node capacitor portion is peeled, and thereafter a cap oxide film (BPSG film) 16-1 remaining on the polysilicon 10-1 is removed. For this purpose, a method employing, e.g., gas-phase hydrofluoric acid, capable of selectively etching a BPSG film is employed.

Since gas-phase hydrofluoric acid does not substantially etch a non-doped oxide film, while the cap oxide film (BPSG film) 16-1 is etched, the insulating interlayer film 8 is not etched.

Figure 5E:
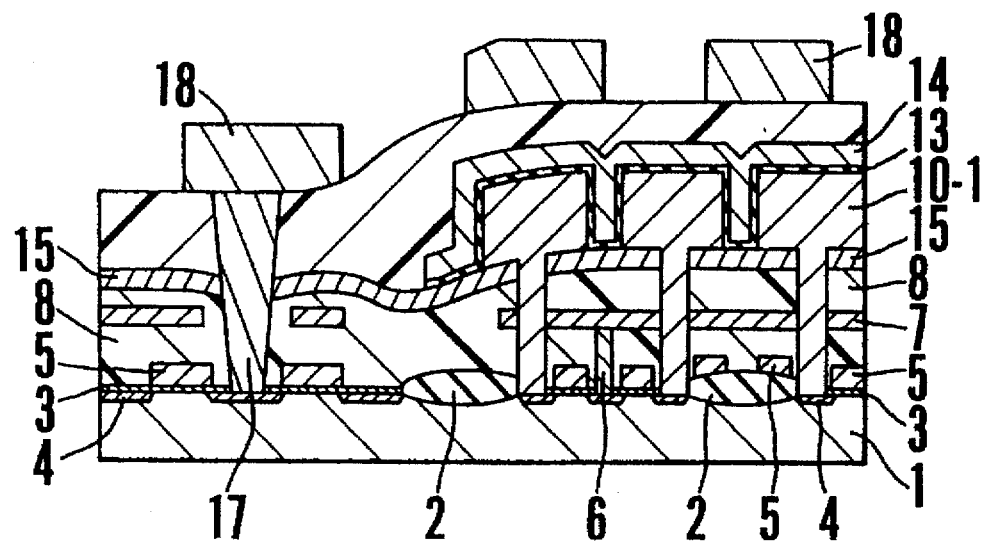

A storage node capacitor film 13, an upper electrode 14 of the storage node capacitor portion, a contact 17, and an upper layer wiring 18 are formed by using a known method (FIG. 5E).

What I claim is:

1. A method of manufacturing a semiconductor integrated circuit device which stores information by storing charges in a capacitor portion formed on a semiconductor substrate, comprising the steps of depositing a conductive film for forming a lower electrode of a storage node capacitor portion on an insulating interlayer film formed with a contact hole for forming a contact that connects said capacitor portion with said substrate, depositing a cap oxide film on said conductive film and planarizing said cap oxide film, applying a resist on said planarized cap oxide film to a uniform thickness and forming a pattern mask of said storage node capacitor portion from said resist, etching said cap oxide film and said conductive film by using said pattern mask as a mask, and forming a lower electrode of said storage node capacitor portion by removing said cap oxide film.

2. A method according to claim 1, wherein said conductive film is a polysilicon film and said cap oxide film is a silicon oxide film.

3. A method according to claim 1, wherein at least an uppermost layer portion of said insulating interlayer film is formed of a non-doped silicon oxide film, said cap oxide film is formed of a silicon oxide film doped with boron and phosphorus, and after formation of said storage node capacitor portion, only said cap oxide film is selectively etched.

4. A method according to claim 2, wherein at least an uppermost layer portion of said insulating interlayer film is formed of a non-doped silicon oxide film, said cap oxide film is formed of a silicon oxide film doped with boron and phosphorus, and after formation of said storage node capacitor portion, only said cap oxide film is selectively etched.

5. A method according to claim 1, wherein gas-phase hydrofluoric acid is used to selectively etch said cap oxide film.

6. A method according to claim 2, wherein gas-phase hydrofluoric acid is used to selectively etch said cap oxide film.

7. A method according to claim 3, wherein gas-phase hydrofluoric acid is used to selectively etch said cap oxide film.

* * * * *

UNITED STATES PATENT AND TRADEMARK OFFICE
CERTIFICATE OF CORRECTION

PATENT NO. : 5,691,222
DATED : November 25, 1997
INVENTOR(S) : Tadashi FUKASE

It is certified that error appears in the above-indentified patent and that said Letters Patent is hereby corrected as shown below:

On the title page, item (30), delete "Nov. 10, 1996" and "8-292363" and insert --Nov. 10, 1995-- and --7-292363--.

Signed and Sealed this

Twenty-first Day of April, 1998

Attest:

BRUCE LEHMAN

*Attesting Officer*  *Commissioner of Patents and Trademarks*